United States Patent
Cheng et al.

(10) Patent No.: US 10,373,818 B1
(45) Date of Patent: Aug. 6, 2019

(54) METHOD OF WAFER RECYCLING

(71) Applicant: Taiwan Semiconductor Manufacturing Co., Ltd., Hsinchu (TW)

(72) Inventors: Yi-Hua Cheng, Chiayi County (TW); Yen-Hsun Wu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/885,311

(22) Filed: Jan. 31, 2018

(51) Int. Cl.
*H01L 21/02* (2006.01)
*H01L 21/311* (2006.01)
*H01L 21/306* (2006.01)

(52) U.S. Cl.
CPC .... *H01L 21/02032* (2013.01); *H01L 21/0228* (2013.01); *H01L 21/02148* (2013.01); *H01L 21/30625* (2013.01); *H01L 21/31111* (2013.01)

(58) Field of Classification Search
CPC ......... H01L 21/02032; H01L 21/02148; H01L 21/0228
See application file for complete search history.

(56) References Cited

U.S. PATENT DOCUMENTS

2010/0200854 A1* 8/2010 Alami-Idrissi .... H01L 21/02032
257/49

* cited by examiner

*Primary Examiner* — Errol V Fernandes
(74) *Attorney, Agent, or Firm* — Seed Intellectual Property Law Group LLP (57) ABSTRACT

Methods are provided for recycling a dummy wafer so that the dummy wafer may be repeatedly used in a deposition process. The dummy wafer includes a substrate and an oxide layer on the substrate that is formed by the deposition process. A thickness of the oxide layer on the dummy wafer may be measured, and the dummy wafer may be subjected to recycling depending on whether the measured thickness of the oxide layer exceeds a threshold thickness. The dummy wafer is recycled by removing the oxide layer, which may be accomplished by performing an etching process. A mechanical polishing process may be performed to smooth the surface of the substrate. The dummy wafer may then be reused in a subsequent deposition process.

20 Claims, 4 Drawing Sheets

METHOD OF WAFER RECYCLING

BACKGROUND

A variety of processes are performed in the fabrication of semiconductor devices. For example, deposition processes are performed in the fabrication of some semiconductor devices to form a layer or film of an oxide or other material. Deposition processes may be carried out on a batch of semiconductor wafers, as opposed to depositing the layers on wafers one at a time. The batch of wafers that are exposed to a particular deposition process may include production wafers, which are the wafers on which the semiconductor devices are formed, and may also include dummy wafers. The dummy wafers are sometimes included in a batch of wafers so that uniform deposition on the production wafers of oxides or other materials can be achieved, e.g., the dummy wafers may be included in order to provide a desired number of total wafers in the batch, for example, in a case where less than a full batch of production wafers are available for processing and the processing is sensitive to the number/load of wafers being processed. The dummy wafers are thus subjected to the same deposition of material as are the production wafers; however, the dummy wafers do not typically proceed to further processing steps in the production of the semiconductor devices. Rather, the dummy wafers are typically discarded after a certain number of uses, or after the dummy wafers have accumulated a certain thickness of the deposited material. Discarding dummy wafers increases the costs of producing the production wafers.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following description of various embodiments refers to a dummy wafer or dummy wafers as examples of wafers that can be treated in accordance with the various methods described herein, and refers to hafnium oxide as an example of oxide materials that are deposited on wafers in accordance with embodiments described herein; however, the description of the various embodiments is not limited to processing of dummy wafers or using hafnium oxide as the oxide material that is deposited on the wafers. For example, other oxide materials include oxide materials used in the production of semiconductor devices that are deposited as thin films, e.g., other high-k dielectric materials, including hafnium silicon oxide (HfSiO), hafnium silicon oxynitride (HfSiON), hafnium tantalum oxide (HMO), hafnium titanium oxide (HMO), hafnium zirconium oxide (HfArO) and combinations thereof. Suitable materials for use in accordance with embodiments described herein include materials used in the production of semiconductor structures that can be deposited using one or more of chemical vapor deposition (CVD), atomic layer deposition (ALD), physical vapor deposition (PVD), plasma enhanced CVD (PECVD), low-pressure CVD (LPCVD), or other deposition techniques.

Embodiments described herein include a wafer processing method that permits wafers, e.g., dummy wafers, including a substrate upon which an oxide material has been deposited, to be recycled for reuse in subsequent deposition cycles with a new batch of production wafers. Embodiments of described methods include an etching process performed on the dummy wafer to remove the oxide layer from the substrate. Implementations of described methods include performing a mechanical polishing process on the wafer after the etching process. After performing methods in accordance with disclosed embodiments, the dummy wafer is in condition for reuse in a semiconductor device fabrication process with a new batch of production wafers, for example, in an oxide deposition process.

In some embodiments the etchant includes hydrofluoric acid and the polishing includes chemical-mechanical planarization.

Figure 1:
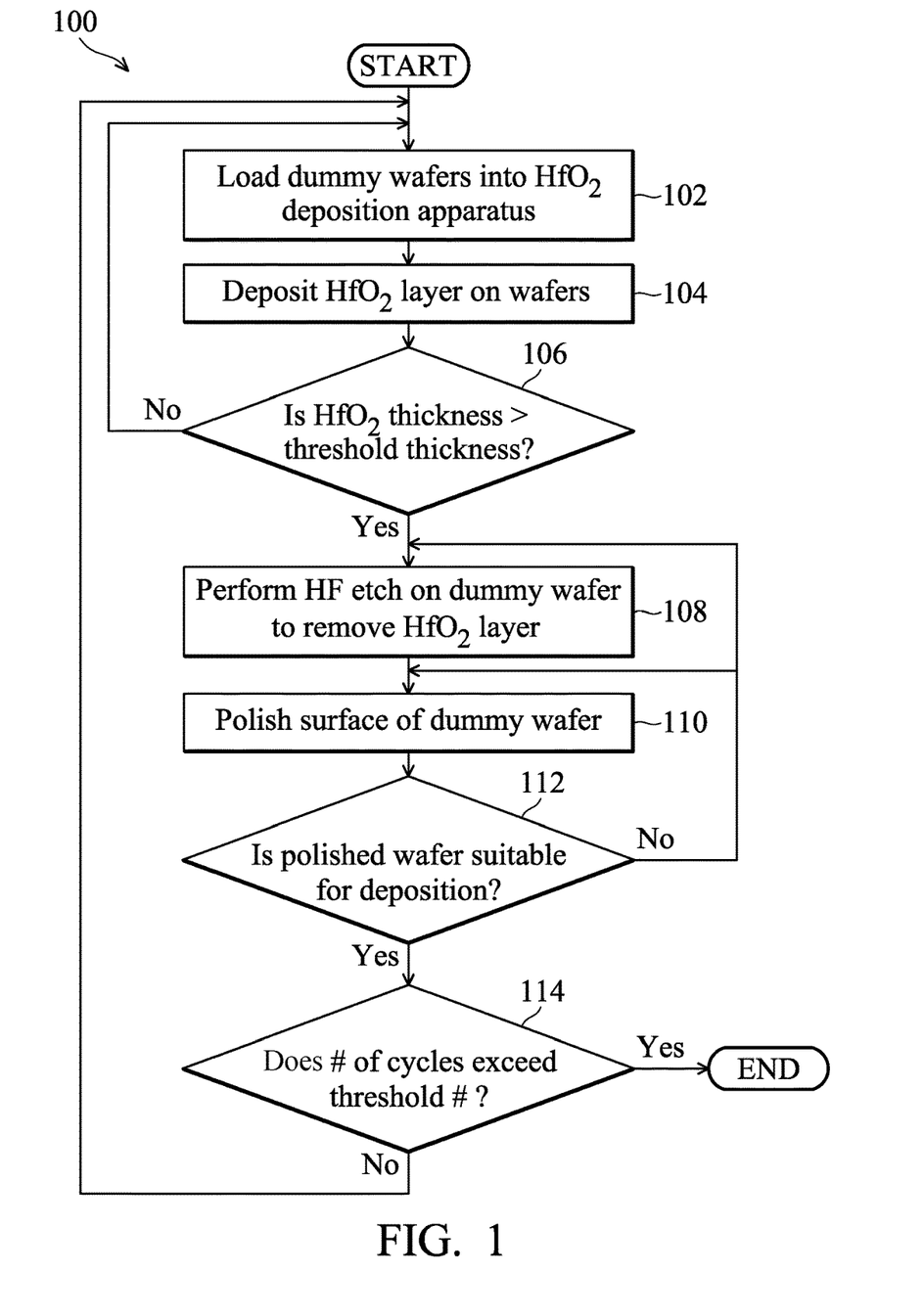
FIG. 1 is a flowchart illustrating a wafer processing method, in accordance with some embodiments.

FIG. 1 is a flowchart illustrating a wafer processing method 100, in accordance with one or more embodiments of the present disclosure. At 102, wafers are loaded into a material, e.g., hafnium oxide ($HfO_2$), deposition apparatus.

Figure 2:
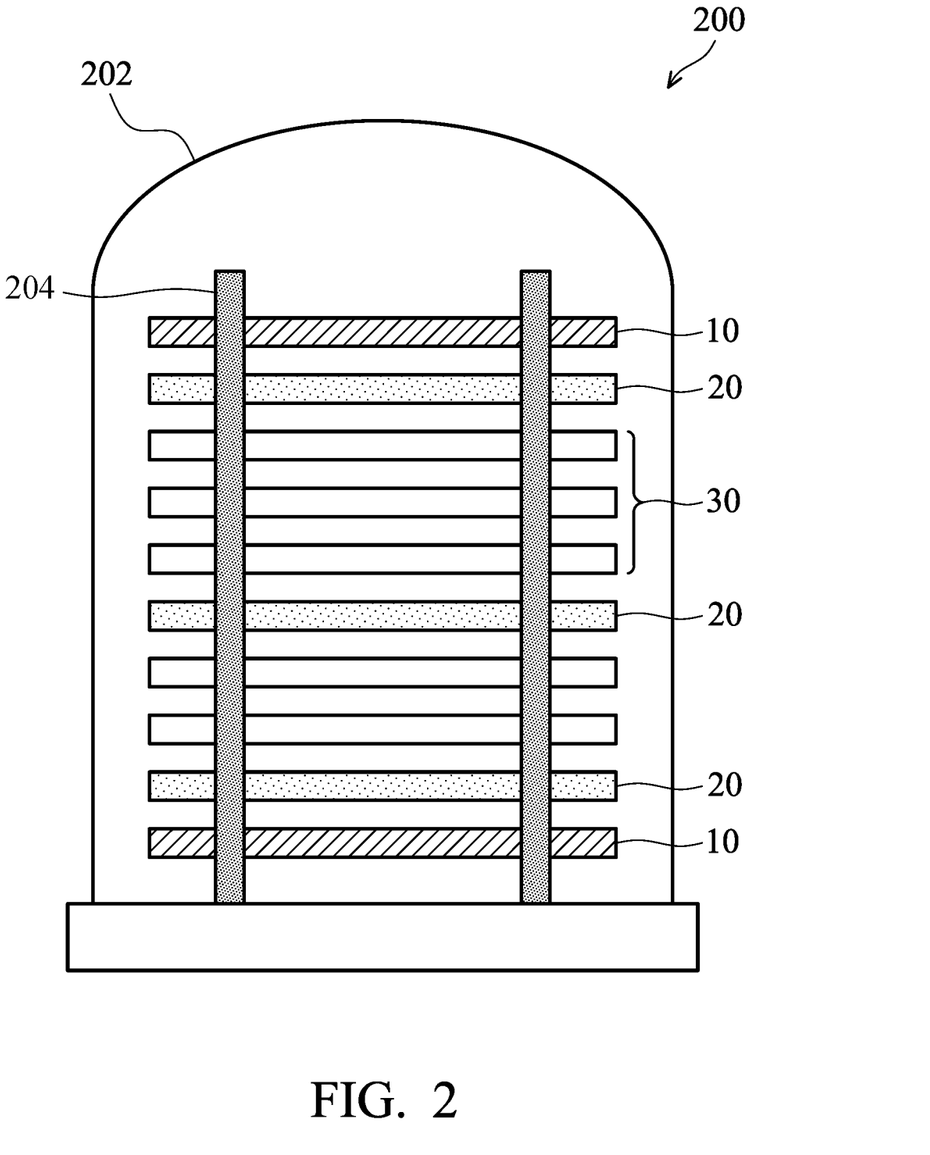
FIG. 2 is a schematic illustration of a deposition apparatus that may be used for depositing an oxide layer on wafers, in accordance with some embodiments.

FIG. 2 illustrates a deposition apparatus 200 which is used for depositing a $HfO_2$ layer on wafers, in accordance with embodiments of the present disclosure. The wafers include at least one dummy wafer 10 and one or more production wafers 30. The wafers may also include one or more particle control wafers 20. The dummy wafers 10 are non-production wafers included with the production wafers so that uniform deposition of oxides or other materials on the production wafers can be achieved. For example, the dummy wafers consume process gas in the $HfO_2$ deposition apparatus in order to maintain a consistent, uniform deposition of $HfO_2$ on the production wafers 30. Dummy wafers are commonly used in the case where less than a full batch of production wafers are available for processing and the processing is sensitive to the number/load of wafers being processed. When the particle control wafers 20 are processed along with the production wafers 30, they are used to monitor the processing of the production wafers 30. For example, the particle control wafers 20 may be used to measure a thickness of layers deposited during processing of the wafers, to monitor or measure defects introduced by the processing, and so on. The production wafers 30 are wafers that are used to form semiconductor devices, such as circuit components, integrated circuits, chips, or the like.

The dummy wafer 10 may be any wafer onto which a layer or thin film of $HfO_2$ may be deposited. For example, the dummy wafer 10 may be a monocrystalline silicon (Si) wafer, an amorphous Si wafer, a gallium arsenide (GaAs) wafer, or any other semiconductor wafer suitable to consume process gases in an $HfO_2$ deposition process so that a layer or thin film of $HfO_2$ is deposited on a surface of the dummy wafer 10.

As shown in FIG. 2, the deposition apparatus 200 includes a process chamber 202 into which the wafers are loaded on a boat or carrier 204. The boat 204 is used to support the wafers and hold the wafers in a desired position within the process chamber 202 during the deposition process. The boat 204 may be formed of, or otherwise includes, one or more supports, and may further include upper and lower plates positioned at top and bottom positions, respectively, along the supports. The wafers are disposed between the upper and lower plates, for example, in slots formed in the supports that hold edges of the wafers in particular spaced-apart positions.

The boat 204 may hold any number of wafers, for example, 50 or 100 or more or fewer wafers, during the $HfO_2$ layer deposition. In one or more embodiments, the boat 204 holds a batch of one-hundred (100) wafers during the $HfO_2$ layer deposition. The batch of 100 wafers may include any combination of dummy wafers 10, particle control wafers 20, and production wafers 30.

The dummy wafers 10 are positioned at top and bottom positions in the boat 204, e.g., adjacent to the upper and lower plates, as shown. At the top and bottom positions within the process chamber 202, deposition conditions may be non-ideal, such that deposition may be non-uniform in these regions due to various factors such as non-uniform temperature control, gas flow, gas pressure, or the like. Thus, by placing the dummy wafers 10 at the top and bottom positions of the boat 204, as shown in FIG. 2, the dummy wafers 10 may consume the process gasses in these regions of the process chamber 202, while the production wafers 30 may be positioned between the dummy wafers 10 and subjected to a more uniform $HfO_2$ layer deposition. The particle control wafers 20 may be positioned anywhere between the dummy wafers 10, and may be positioned between production wafers 30.

Referring again to FIG. 1, at 104 an $HfO_2$ layer is deposited on the wafers. The deposition apparatus 200 is any apparatus capable of depositing a layer of $HfO_2$ on surfaces of the wafers. For example, the deposition apparatus 202 is any apparatus that deposits $HfO_2$ by chemical vapor deposition (CVD), atomic layer deposition (ALD), physical vapor deposition (PVD), plasma enhanced CVD (PECVD), low-pressure CVD (LPCVD), or any other deposition technique suitable to deposit an $HfO_2$ layer to desired specifications as may be set based on a final structure to be formed on the production wafers 30.

The deposition apparatus 200 includes various well-known components, features, and functionalities needed to deposit an $HfO_2$ layer on one or more surfaces of the wafers in the boat 204. For example, the process chamber 202 may include tubes, gas injection ports, heaters, exhaust ports, and the like. The deposition of the $HfO_2$ layer is performed under suitable deposition conditions within the process chamber 202, which include suitable temperature, gas flow rate, pressure, deposition time, and so on.

In accordance with embodiments described herein, the $HfO_2$ layer is deposited as a thin film that forms on one or more surfaces of the dummy wafers 10, the particle control wafers 20, and the production wafers 30. The $HfO_2$ layer on the particle control wafers 20 and on the production wafers 30 is deposited to have a desired thickness, however, the thickness of the $HfO_2$ layer formed on the dummy wafers 10 may vary somewhat from the thickness of the $HfO_2$ layer formed on the particle control wafers 20 and the production wafers 30. This variation in thickness of the deposited layer is a result of the deposition conditions being different in the upper and lower regions of the process chamber 202 where the dummy wafers 10 are positioned.

Figure 3A:
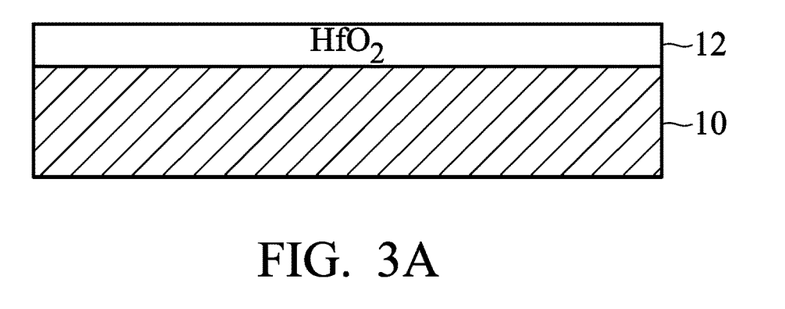
FIG. 3A is a cross-sectional view illustrating a wafer after deposition of an oxide layer, in accordance with some embodiments.

FIG. 3A is a cross-sectional view illustrating a dummy wafer 10 after deposition of an $HfO_2$ layer 12, for example, at 104 of FIG. 1. While the $HfO_2$ layer 12 is shown as being deposited on only one surface of the dummy wafer 10, it should be readily appreciated that in various embodiments, a $HfO_2$ layer may be deposited on more than one, or even on all, exposed surfaces of the dummy wafer 10.

The deposition apparatus 200 is configured to deposit the $HfO_2$ layer having a particular thickness on the processed batch of wafers, which includes the dummy wafers 10, the particle control wafers 20, and the production wafers 30. The thickness of the deposited layer may be varied, for example the thickness may be less than 600 nm, less than 300 nm, or less than 100 nm in various embodiments. In other embodiments, the thickness of the deposited layer is more than 600 nm.

Referring again to FIG. 1, at 106, the method 100 includes determining whether a thickness of the $HfO_2$ layer deposited on the dummy wafer 10 exceeds a threshold thickness. The thickness of the $HfO_2$ layer on the dummy wafer 10 may be determined by any suitable thickness measuring device for measuring an oxide layer thickness on a semiconductor wafer. Such thickness measuring devices may include, for example, optical measurement devices that use interferometry, ellipsometry or the like, capacitance-based probes or gages, or any other device suitable for measuring the thickness of the deposited $HfO_2$ layer.

The threshold thickness of the $HfO_2$ layer on the dummy wafer 10 is greater than the target thickness of the $HfO_2$ layer that is deposited in one deposition cycle on the batch of wafers. For example, in one or more embodiments, the threshold thickness of the $HfO_2$ layer on the dummy wafer 10 may be selected from within a range of 400 nm to 1000 nm, inclusive. In one or more embodiments, the threshold thickness of the $HfO_2$ layer may be 600 nm. In other embodiments, the threshold thickness is more than or less than 600 nm and may be less than 400 nm or greater than 1000 nm.

The threshold thickness is selected based on various factors, including, for example, the stress that may be induced on the dummy wafer 10 due to the thickness of the $HfO_2$ layer that builds up on the dummy wafer 10 after one or more deposition cycles. For example, if the thickness of the $HfO_2$ layer becomes too large or exceeds the threshold thickness, the dummy wafer may become stressed and may break or experience other undesirable defects.

In a case where the dummy wafer 10 is a new or recycled dummy wafer and is therefore generally free of any $HfO_2$ layer when it is loaded into the deposition apparatus 200 (e.g., at 102 of FIG. 1), the dummy wafer 10 will likely have an $HfO_2$ layer thickness after one deposition cycle (e.g., at 106 of FIG. 1) that is less than the threshold thickness. For example, in one deposition cycle, the dummy wafer 10 may receive a $HfO_2$ layer having a thickness that is less than 100 nm, as measured at 106 FIG. 1. In an embodiment where the threshold thickness is 600 nm, the measured thickness of the $HfO_2$ layer is less than the threshold thickness. When the measured thickness of the deposited layer is less than the threshold thickness, as illustrated at 106 in FIG. 1, dummy wafer 10 is returned to the beginning of method 100 without further treatment. In other words, when the measured thickness of the deposited layer on the dummy wafer is less than the threshold thickness, dummy wafer 10 does not require any special treatment before it can be used in a subsequent deposition cycle with the same batch of wafers or a subsequent deposition cycle with another, different batch of wafers.

On the other hand, when the determined thickness of the $HfO_2$ layer on the dummy wafer 10 exceeds the threshold thickness, in accordance with determination block 106 in FIG. 1, dummy wafer 10 is processed to prepare it for reuse. Referring to 108 in FIG. 1, when the determined thickness of the $HfO_2$ layer exceeds the threshold thickness, dummy wafer 10 is subjected to a process to remove the accumulated $HfO_2$ layer. The process used to remove the accumulated $HfO_2$ layer includes an etching process or any other suitable process for removing the $HfO_2$ layer with little or no damage to the underlying substrate.

A suitable etching process performed at 108 is a wet etching process using an etchant to remove the $HfO_2$ layer. In one or more embodiments, a hydrogen fluoride (HF) solution, or hydrofluoric acid, is used as the etchant to remove the $HfO_2$ layer. Embodiments described herein are not limited to using hydrofluoric acid as an etchant and other etchants suitable for removing the $HfO_2$ layer from the wafer can be used. In embodiments where the deposited layer of oxide to be removed is not $HfO_2$, HF solution etchants or etchants other than an HF solution can be used, including etchants that are known to remove the target oxide. The dummy wafer 10 may be immersed in a bath of HF etchant to remove the $HfO_2$ layer, or the $HfO_2$ layer may be removed by an HF vapor that is supplied to one or more surfaces of the dummy wafer 10 in a vapor etching process.

The etchant and the etching conditions are selected to remove a desired thickness of the $HfO_2$ layer. For example, if the threshold thickness of the $HfO_2$ layer on the dummy wafer 10 is 600 nm, the etchant, etch rate, etch time, temperature and other appropriate etching conditions are selected to remove as much as possible of the 600 nm thick $HfO_2$ layer without removing or damaging the underlying dummy wafer 10. In one or more embodiments, the etchant is a 49% HF solution, e.g., hydrofluoric acid containing 49% by weight of hydrogen fluoride (HF), and the etch time may be equal to or greater than 30 minutes, and in various embodiments the etch time may be equal to or greater than 40 minutes. These etching conditions have resulted in the removal of all, or substantially all, of the 600 nm thick $HfO_2$ layer on the dummy wafer 10. In accordance with other embodiments, the HF solution contains more than or less than 49% by weight hydrogen fluoride and the etch time is greater than or less than 40 minutes.

Figure 3B:
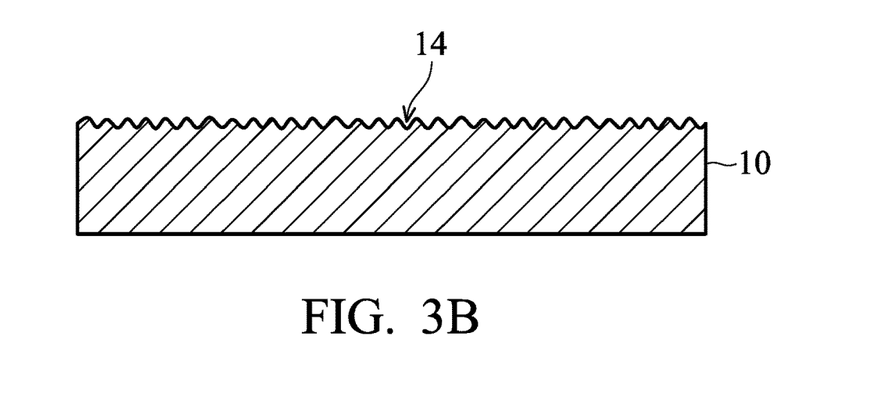
FIG. 3B is a cross-sectional view illustrating the wafer after etching has been performed to remove the oxide layer, in accordance with some embodiments.

FIG. 3B is a cross-sectional view illustrating the dummy wafer 10 after HF etching has been performed to remove the $HfO_2$ layer 12 at 108 of FIG. 1. As seen from FIG. 3B, the surface 14 of the dummy wafer 10 is rough or uneven after the HF etching. This rough surface may cause defects during a subsequent deposition of an $HfO_2$ layer during use of the dummy wafer 10 in another deposition cycle.

In accordance with some embodiments described herein, at 110 in FIG. 1, the dummy wafer 10 is polished to reduce surface roughness and to smooth the surface of the dummy wafer 10. Suitable polishing processes include polishing processes that smooth the surface of the dummy wafer 10 so that an $HfO_2$ layer may be evenly deposited on the surface of the dummy wafer 10 in a subsequent deposition cycle. In one or more embodiments, a chemical-mechanical planarization (CMP) or polishing process is performed at 110 to smooth the surface of the dummy wafer 10. In one or more embodiments, the polishing process removes a thickness of the dummy wafer 10 within a range from 0.5 µm to 1 µm, inclusive. In other embodiments, more than 1 µm or less than 0.5 µm are removed from the dummy wafer 10.

Figure 3C:
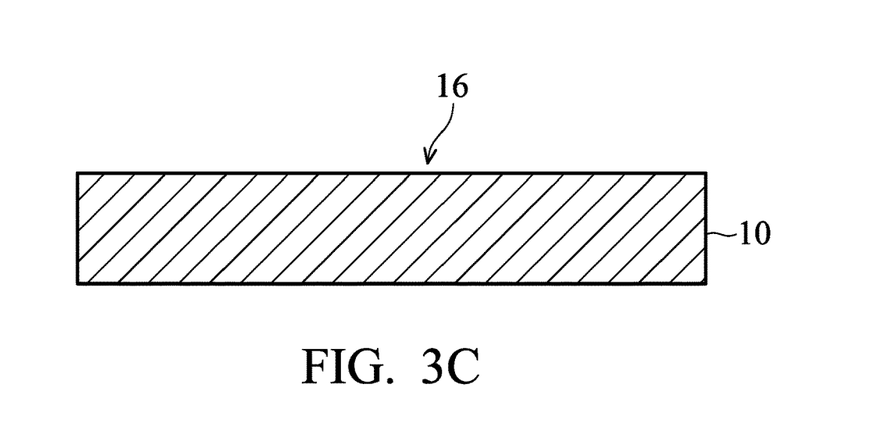
FIG. 3C is a cross-sectional view illustrating the wafer after polishing has been performed, in accordance with some embodiments.

FIG. 3C is a cross-sectional view illustrating the dummy wafer 10 after polishing has been performed at 110 of FIG. 1. As can be seen from FIG. 3C, the surface 16 of the dummy wafer 10 is smooth and even after the polishing. The smooth surface facilitates even deposition of an $HfO_2$ layer during use of the dummy wafer 10 in another deposition cycle.

At 112 in FIG. 1, the dummy wafer 10 is inspected, for example, by an imaging machine, to determine whether a sufficient amount of the $HfO_2$ layer has been removed such that the dummy wafer 10 is suitable for use as a dummy wafer in another deposition cycle. In some embodiments, determining whether sufficient amounts of the $HfO_2$ layer have been removed involves determining whether any of the $HfO_2$ layer remains on the surface of the polished dummy wafer. In some embodiments, the inspection checks for other defects in the dummy wafer that would make it unsuitable for use as a dummy wafer in another deposition cycle. In yet other embodiments, other criteria are used to determine whether the polished dummy wafer is suitable for use as a dummy wafer in another deposition cycle. If the inspection indicates the dummy wafer is suitable for another deposition cycle, then the dummy wafer 10 is reused in the method 100. If the inspection determines the polished dummy wafer is not suitable for another deposition cycle, e.g., insufficient amounts of the $HfO_2$ layer were removed or the wafer surface has too many defects, the polished dummy wafer 10 is subjected to another HF etch 108 and/or polish 110. That is, the dummy wafer 10 is returned to the etching process at 108, or may be returned to the polishing process at 110. The reason why the dummy wafer was determined to be unsuitable for another deposition cycle is used to determine whether the dummy wafer 10 will undergo both a repeated etching process and polishing process, or only the polishing process or only the etching process. For example, if the inspection at 112 reveals that the $HfO_2$ layer has been suitably removed, but the surface of the dummy wafer 10 is not as smooth as desired, the dummy wafer 10 is returned to the polishing process at 110. On the other hand, if the inspection at 112 reveals that the $HfO_2$ layer has not been suitably removed, the dummy wafer 10 is returned to the etching process at 108, which is followed by the polishing process at 110.

The inspection at 112 may be performed, for example, by an imaging machine that images the surface of the dummy wafer 10. The imaging machine may be, for example, a defect inspection system, including an optical imaging machine, optical scattering machine, or the like, and may utilize automatic defect classification equipment and techniques to automatically classify detected defects. The imaging machine may detect the presence of defects on the dummy wafer 10, and further may identify the spatial locations of such defects on the surface of the dummy wafer 10.

If the dummy wafer 10 is determined to be suitable for a subsequent deposition cycle at 112, e.g., if the surface of the dummy wafer 10 is determined to be suitably free of defects, the dummy wafer 10 is returned to the start of the method 100 for reuse as a dummy wafer in a new $HfO_2$ layer deposition cycle.

In some embodiments, method 100 includes, at 114, determining whether a number of etching/polishing cycles performed on the dummy wafer 10 exceeds a threshold number of etching/polishing cycles. Embodiments of the wafer processing method describe herein include one or both of the etching process at 108 and the polishing process at 110. Thus, the number of times that a particular dummy wafer 10 has undergone one or more of these processes is compared to a threshold at 114. If the dummy wafer 10 has been etched/polished more than the threshold number of times, the dummy wafer 10 is deemed unsuitable for further use as a dummy wafer 10 in the method 100. That is, the dummy wafer 10 will not be subjected to any further deposition or recycling processes, but instead will be disposed of or used in some other way. However, if fewer than the threshold number of etching/polishing cycles have been carried out on the dummy wafer 10, the dummy wafer 10 is returned to the beginning of the method 100, where it is used in a new batch of wafers in the $HfO_2$ layer deposition at 102 of FIG. 1.

Figure 4A:
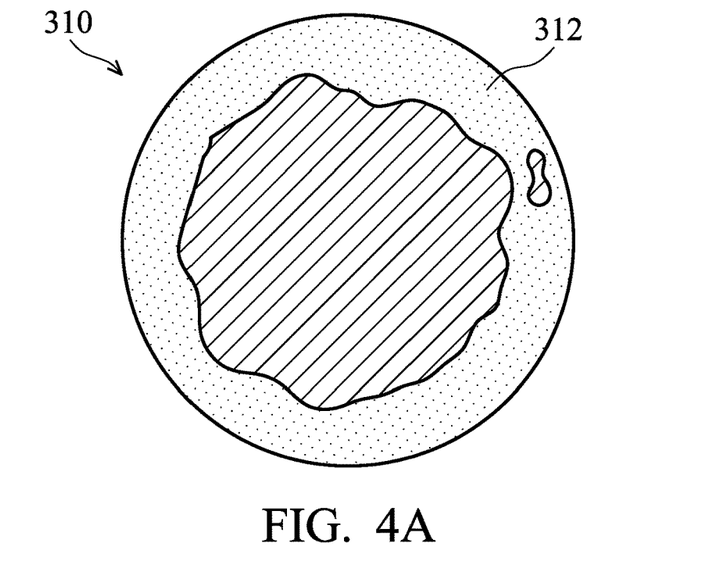
FIG. 4A is an illustration showing a surface of a wafer that was subjected to only a polishing process to remove a deposited oxide layer.

FIG. 4A is an illustration showing a surface of a dummy wafer 310 that underwent a polishing process to remove a deposited $HfO_2$ layer. An $HfO_2$ layer of about 600 nm thickness was deposited on the dummy wafer 310. The dummy wafer 310 was then polished using CMP to remove between about 0.5 μm and 1 μm of thickness, which included removal of some of the $HfO_2$ layer as well as removal of some of the underlying wafer material. However, as shown in FIG. 4A, the polishing did not completely remove the $HfO_2$ layer. In particular, after polishing, portions 312 of the $HfO_2$ layer remained in edge regions of the dummy wafer. The remaining portions 312 of the $HfO_2$ layer are shown in FIG. 4A as the stippled region near the perimeter of the dummy wafer 310, which surrounds a central region of the dummy wafer 310 where the $HfO_2$ layer was removed by the polishing. These remaining portions 312 of the $HfO_2$ layer are undesirable because they peel from the dummy wafer 310 when the dummy wafer 310 is included with a new batch of wafers in a new $HfO_2$ layer deposition cycle.

Figure 4B:
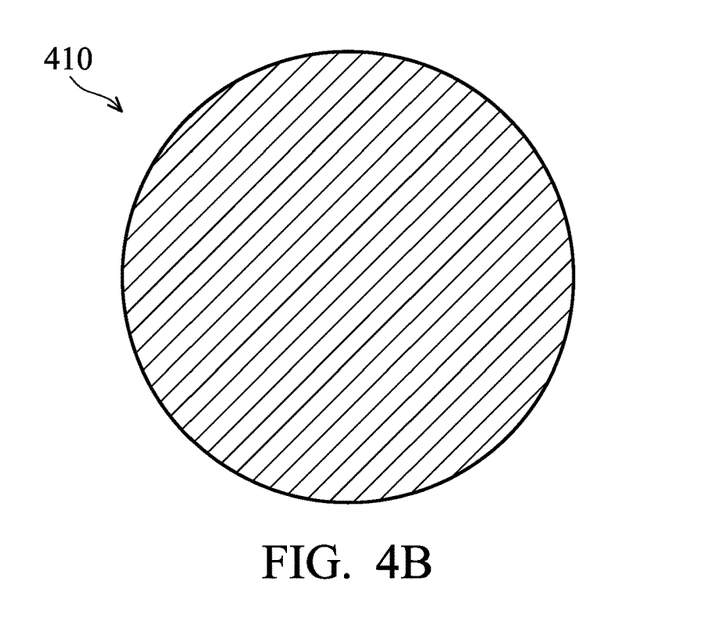
FIG. 4B is an illustration showing a surface of a wafer that underwent an etching process and a polishing process to remove a deposited oxide layer, in accordance with some embodiments.

FIG. 4B is an illustration showing a surface of a dummy wafer 410 that underwent an etching process and a polishing process to remove a deposited $HfO_2$ layer in accordance with embodiments described herein. An $HfO_2$ layer of about 600 nm thickness was deposited on the dummy wafer 410. The dummy wafer 410 was then subjected to an HF etching process using a 49% HF solution for an etch time of 40 minutes. Next, the dummy wafer 410 was polished using CMP to remove between about 0.5 μm and 1 μm of thickness, which included removal of the $HfO_2$ layer as well as removal of some of the underlying wafer material. In contrast to the dummy wafer 310 shown in FIG. 4A, the dummy wafer 410 shown in FIG. 4B was nearly completely free of any residual $HfO_2$ layer that was not removed by the etching process and the polishing process. The nearly defect-free dummy wafer 410 shown in FIG. 4B is suitable for a repeated use in a new batch of wafers to be subjected to a new $HfO_2$ layer deposition cycle.

The present disclosure provides, in various embodiments, methods that may be utilized to recycle and reuse dummy wafers, thereby facilitating repeated use of a single dummy wafer in multiple deposition processes using different batches of wafers. This results in cost savings, since the dummy wafer does not need to be discarded after a single use, or even after a certain number of deposition cycles or after a certain thickness of deposited material has accumulated. Instead, the methods described by the present disclosure allow the deposited material to be removed from the dummy wafer, the surface of the dummy wafer to be smoothed, and the dummy wafer made suitable for reuse with another batch of wafers for a new deposition cycle.

According to one embodiment, a wafer processing method includes receiving a dummy wafer that includes a substrate and an oxide layer over the substrate. An etching process is performed on the wafer to remove the oxide layer. The method further includes performing a mechanical polishing process on the wafer. The wafer is then reused in a semiconductor process.

According to another embodiment, a method is provided that includes depositing hafnium oxide ($HfO_2$) on a first batch of semiconductor wafers. The first batch of semiconductor wafers includes a first production wafer, a first particle control wafer, and a dummy wafer. The method further includes removing the deposited hafnium oxide from the dummy wafer by etching the dummy wafer with a hydrofluoric acid solution, and polishing the dummy wafer by chemical-mechanical planarization.

According to yet another embodiment, a method is provided that includes depositing hafnium oxide ($HfO_2$) on a first batch of semiconductor wafers that includes a first plurality of production wafers, a first particle control wafer, and a dummy wafer. A thickness of a first hafnium oxide layer on the dummy wafer is measured, and a determination is made as to whether the measured thickness of the first hafnium oxide layer exceeds a threshold thickness. In response to the measured thickness of the first hafnium oxide layer being less than the threshold thickness, the dummy wafer is reused by depositing hafnium oxide on a second batch of semiconductor wafers that includes the dummy wafer, along with a second plurality of production wafers and a second particle control wafer. A thickness of a second hafnium oxide layer on the dummy wafer is measured, and the second hafnium oxide layer includes the first hafnium oxide layer. The method further includes determining whether the measured thickness of the second hafnium oxide layer exceeds the threshold thickness. In response to the measured thickness of the second hafnium oxide layer exceeding the threshold thickness, the method includes removing the second hafnium oxide layer from the dummy wafer by etching the dummy wafer with a hydrofluoric acid solution, and polishing the dummy wafer by chemical-mechanical planarization.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A wafer processing method, comprising:
   receiving a wafer, the wafer including a substrate and a first oxide layer over the substrate;
   determining whether a thickness of the first oxide layer exceeds a threshold thickness;
   performing an etching process to remove the first oxide layer in response to determining the thickness of the first oxide layer exceeds the threshold thickness;
   performing a mechanical polishing process on the wafer; and
   reusing the wafer in a semiconductor process.

2. The method of claim 1 wherein the reusing the wafer in a semiconductor process includes reusing the wafer in an oxide deposition process.

3. The method of claim 1 wherein the threshold thickness is within a range from 400 nm to 1000 nm, inclusive.

4. The method of claim 1 wherein the wafer is a dummy wafer.

5. The method of claim 1 wherein the etching process utilizes hydrofluoric acid as an etchant.

6. The method of claim 5 wherein the etchant comprises a 49% hydrofluoric acid solution.

7. The method of claim 1 wherein the first oxide layer is a hafnium oxide ($HfO_2$) layer.

8. The method of claim 1 wherein the performing the mechanical polishing process includes performing chemical-mechanical planarization.

9. The method of claim 8 wherein the performing the chemical-mechanical planarization includes removing a portion of the substrate, a thickness of the removed portion of the substrate being within a range from 0.5 µm to 1 µm, inclusive.

10. The method of claim 1, further comprising:
    depositing a second oxide layer on the first oxide layer in response to determining the thickness of the first oxide layer is less than the threshold thickness;
    determining whether a combined thickness of the first and the second oxide layers exceeds the threshold thickness; and
    performing the etching process to remove the first and the second oxide layers in response to determining the combined thickness of the first and the second oxide layers exceeds the threshold thickness.

11. A method, comprising:
    depositing hafnium oxide ($HfO_2$) on a first batch of semiconductor wafers, the first batch of semiconductor wafers including a first production wafer, a first particle control wafer, and a dummy wafer;
    removing the deposited hafnium oxide from the dummy wafer by etching the dummy wafer with a hydrofluoric acid solution; and
    polishing the dummy wafer by chemical-mechanical planarization.

12. The method of claim 11, further comprising:
    depositing hafnium oxide on a second batch of semiconductor wafers, the second batch of semiconductor wafers including a second production wafer, a second particle control wafer, and the dummy wafer.

13. The method of claim 11, further comprising:
    measuring a thickness of the hafnium oxide layer on the dummy wafer; and
    determining whether the measured thickness of the hafnium oxide layer exceeds a threshold thickness,
    wherein the removing the deposited hafnium oxide from the dummy wafer is performed in response to determining the measured thickness of the hafnium oxide layer exceeds the threshold thickness.

14. The method of claim 11, further comprising:
    inspecting a surface of the dummy wafer, subsequent to the polishing the dummy wafer by chemical-mechanical planarization, to determine whether defects are present on the surface of the dummy wafer; and
    in response to determining defects are present on the surface of the dummy wafer:
       etching the dummy wafer with the hydrofluoric acid solution; and
       polishing the dummy wafer by the chemical-mechanical planarization.

15. The method of claim 11 wherein the hydrofluoric acid solution is a 49% hydrofluoric acid solution.

16. The method of claim 15 wherein etching the dummy wafer with the hydrofluoric acid solution includes etching the dummy wafer for an etch time of at least 40 minutes.

17. A method, comprising:
    depositing hafnium oxide ($HfO_2$) on a first batch of semiconductor wafers, the first batch of semiconductor wafers including a first plurality of production wafers, a first particle control wafer, and a dummy wafer;
    measuring a thickness of a first hafnium oxide layer on the dummy wafer;
    determining whether the measured thickness of the first hafnium oxide layer exceeds a threshold thickness;
    in response to determining that the measured thickness of the first hafnium oxide layer is less than the threshold thickness, reusing the dummy wafer by depositing hafnium oxide on a second batch of semiconductor wafers, the second batch of semiconductor wafers including a second plurality of production wafers, a second particle control wafer, and the dummy wafer;
    measuring a thickness of a second hafnium oxide layer on the dummy wafer, the thickness of the second hafnium oxide layer including the thickness of the first hafnium oxide layer;
    determining whether the measured thickness of the second hafnium oxide layer exceeds the threshold thickness;

in response to determining that the measured thickness of the second hafnium oxide layer exceeds the threshold thickness, removing the second hafnium oxide layer from the dummy wafer by etching the dummy wafer with a hydrofluoric acid solution; and polishing the dummy wafer by chemical-mechanical planarization.

18. The method of claim 17 wherein the hydrofluoric acid solution is a 49% hydrofluoric acid solution.

19. The method of claim 18 wherein the etching the dummy wafer with the hydrofluoric acid solution includes etching the dummy wafer for an etch time of at least 40 minutes.

20. The method of claim 17 wherein the polishing the dummy wafer includes removing a portion of the dummy wafer, a thickness of the removed portion of the dummy wafer being within a range from 0.5 μm to 1 μm, inclusive.

\* \* \* \* \*